(12) United States Patent
Miyata et al.

(10) Patent No.: US 12,364,042 B2
(45) Date of Patent: Jul. 15, 2025

(54) OPTICAL ELEMENT HAVING BOTH COLOR FILTER FUNCTION AND LENS FUNCTION, IMAGE SENSOR THEREOF AND IMAGING DEVICE

(71) Applicant: Nippon Telegraph and Telephone Corporation, Tokyo (JP)

(72) Inventors: Masashi Miyata, Musashino (JP); Fumihide Kobayashi, Musashino (JP); Toshikazu Hashimoto, Musashino (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 0 days.

(21) Appl. No.: 18/683,149

(22) PCT Filed: Aug. 18, 2021

(86) PCT No.: PCT/JP2021/030262
§ 371 (c)(1),
(2) Date: Feb. 12, 2024

(87) PCT Pub. No.: WO2023/021632
PCT Pub. Date: Feb. 23, 2023

(65) Prior Publication Data
US 2024/0347566 A1 Oct. 17, 2024

(51) Int. Cl.
*H10F 39/00* (2025.01)
*G02B 5/00* (2006.01)
(Continued)

(52) U.S. Cl.
CPC ........... *H10F 39/8053* (2025.01); *G02B 5/00* (2013.01); *H10F 39/12* (2025.01); *H10F 39/802* (2025.01);
(Continued)

(58) Field of Classification Search
CPC ......... H01L 27/14621; H01L 27/14603; H01L 27/14627; H10F 39/8053; H10F 39/12;
(Continued)

(56) References Cited

U.S. PATENT DOCUMENTS

2009/0250594 A1* 10/2009 Tanaka ............... H10F 39/8063
438/70
2012/0061553 A1* 3/2012 Yokogawa ............ G01J 5/0853
250/208.1
(Continued)

FOREIGN PATENT DOCUMENTS

| JP | 201528960 | 2/2015 |
|---|---|---|
| JP | 202169118 | 4/2021 |
| JP | 202169119 | 4/2021 |

OTHER PUBLICATIONS

Miyata et al., "Color Splitting Micro-metalenses for High-sensitivity Color Image Sensors," 2021 Conference on Lasers and Electro-Optics (CLEO), May 9-14, 2021, San Jose, CA, USA, 2 pages.

*Primary Examiner* — Jennifer D Bennett
*Assistant Examiner* — Erin R Garber
(74) *Attorney, Agent, or Firm* — Fish & Richardson P.C.

(57) ABSTRACT

An optical element includes a transparent layer for covering a plurality of pixels each including a photoelectric conversion element; and a plurality of structures disposed in a plane direction of the transparent layer, on a side opposite to the plurality of pixels with at least a part of the transparent layer interposed therebetween. The plurality of structures are disposed in multiple layers to guide light of a color corresponding to each of the plurality of pixels among incident light to a corresponding pixel.

8 Claims, 25 Drawing Sheets

(51) Int. Cl.
*H10F 39/12* (2025.01)
*G02B 5/20* (2006.01)
(52) U.S. Cl.
CPC ....... *H10F 39/806* (2025.01); *H10F 39/8063* (2025.01); *G02B 5/20* (2013.01); *H10F 39/8067* (2025.01)
(58) Field of Classification Search
CPC .. H10F 39/802; H10F 39/806; H10F 39/8063; H10F 39/8067; G02B 5/00; G02B 5/20
See application file for complete search history.

(56) References Cited

U.S. PATENT DOCUMENTS

| | | | |
|---|---|---|---|
| 2015/0090862 A1* | 4/2015 | Matsui | G02B 5/1876 359/356 |
| 2016/0260762 A1 | 9/2016 | Ungnapatanin et al. | |
| 2020/0388644 A1* | 12/2020 | Arbabi | H01L 27/14605 |
| 2021/0014394 A1* | 1/2021 | Han | G02B 5/286 |
| 2021/0124179 A1 | 4/2021 | Yun et al. | |
| 2021/0126035 A1* | 4/2021 | Roh | H01L 27/14627 |
| 2021/0249459 A1* | 8/2021 | Yun | H04N 23/84 |

\* cited by examiner

OPTICAL ELEMENT HAVING BOTH COLOR FILTER FUNCTION AND LENS FUNCTION, IMAGE SENSOR THEREOF AND IMAGING DEVICE

CROSS-REFERENCE TO RELATED APPLICATIONS

This application is a National Stage application under 35 U.S.C. § 371 of International Application No. PCT/JP2021/030262, having an International Filing Date of Aug. 18, 2021. The disclosure of the prior application is considered part of the disclosure of this application, and is incorporated by reference in its entirety into this application.

TECHNICAL FIELD

The present invention relates to an optical element, an imaging element and an imaging device.

BACKGROUND ART

For example, NPL 1 discloses a technique for realizing functions such as a color filter for an imaging element by disposing a single layer of a fine structure.

CITATION LIST

Non Patent Literature

[NPL 1] Masashi Miyata, Naru Nemoto, Kota Shikama, Fumihide Kobayashi, and Toshikazu Hashimoto, "Color Splitting Micro-metalenses for High-sensitivity Color Image Sensors," in Conference on Lasers and Electro-Optics, OSA Technical Digest (Optical Society of America, 2021), paper FTu2M.5.

SUMMARY OF INVENTION

Technical Problem

For the reason that a phase wavelength dispersion required for a color separation function becomes large, there is no need for a microstructure having a high aspect ratio (AR). The higher the aspect ratio is, the higher the difficulty of manufacturing the microstructure is.

An object of the present invention is to reduce the manufacturing difficulty of the microstructure.

Solution to Problem

An optical element according to the present invention includes a transparent layer for covering a plurality of pixels each including a photoelectric conversion element; and a plurality of structures disposed in a plane direction of the transparent layer, on a side opposite to the plurality of pixels with at least a part of the transparent layer interposed therebetween, in which the plurality of structures are disposed in multiple layers to guide light of a color corresponding to each of the plurality of pixels among incident light to a corresponding pixel.

An imaging element according to the present invention includes the aforementioned optical element, and a plurality of pixels covered with the transparent layer.

An imaging device according to the present invention includes the aforementioned imaging element, and a signal processing unit which generates a pixel signal on the basis of an electrical signal obtained from the imaging element.

Advantageous Effects of Invention

According to the present invention, it is possible to reduce the manufacturing difficulty of the microstructure.

DESCRIPTION OF EMBODIMENTS

Figure 1:
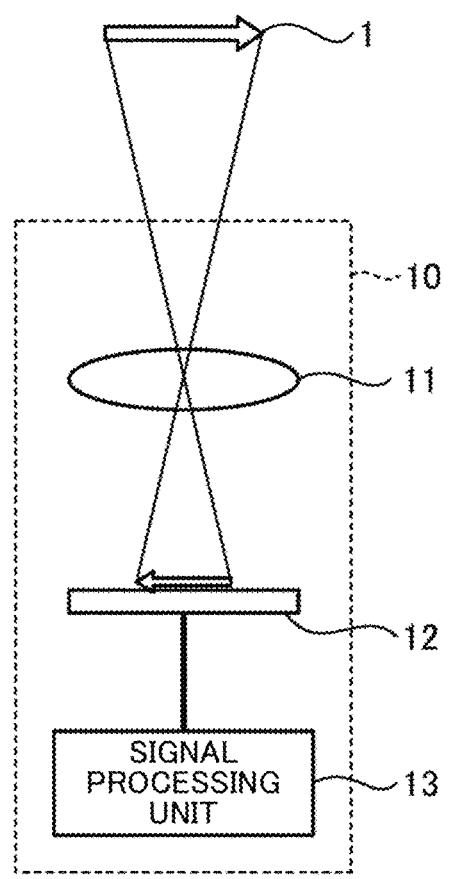
FIG. 1 is a diagram showing an example of a schematic configuration of an imaging element and an imaging device using an optical element according to an embodiment.

Hereinafter, embodiments of the invention will be described in conjunction with the accompanying drawings.

The shapes, sizes, positional relationships and the like shown in the drawings are merely schematic, and the present invention is not limited thereto. The same parts are denoted by the same reference numerals, and repeated explanation will not be provided.

FIG. 1 is a diagram showing an example of a schematic configuration of an imaging element and an imaging device using an optical element according to an embodiment. An imaging device 10 images an object 1 using light from the object 1 (subject) shown as a white arrow as incident light. The incident light is made incident on an imaging element 12 via a lens optical system 11. A signal processing unit 13 processes an electric signal that is output from the imaging element 12 to generate an image signal.

Figure 2:
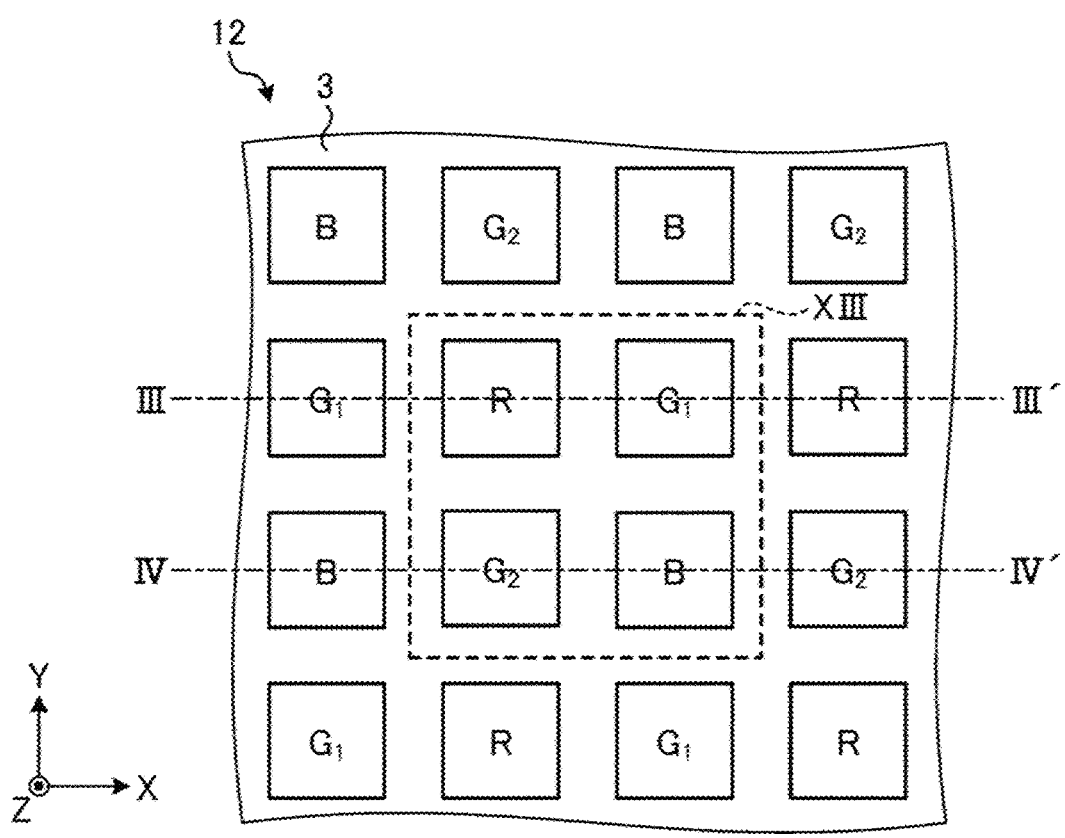
FIG. 2 is a diagram showing an example of a schematic configuration of the imaging element.
Figure 3:
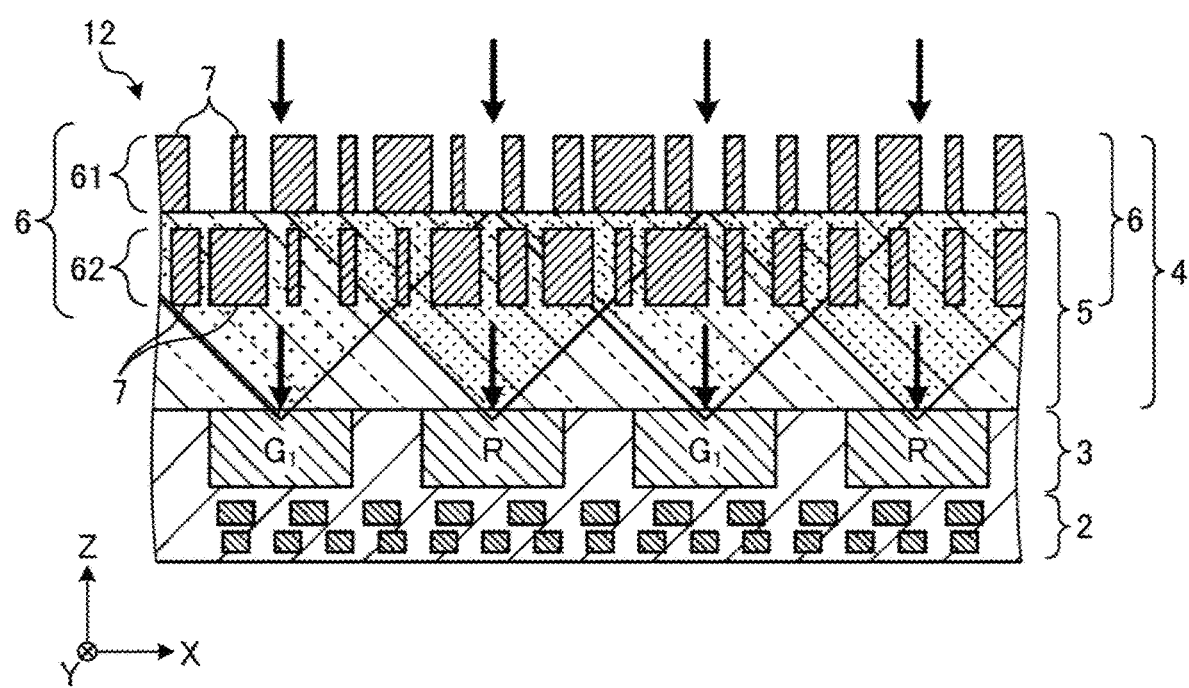
FIG. 3 is a diagram showing an example of a schematic configuration of the imaging element.
Figure 4:
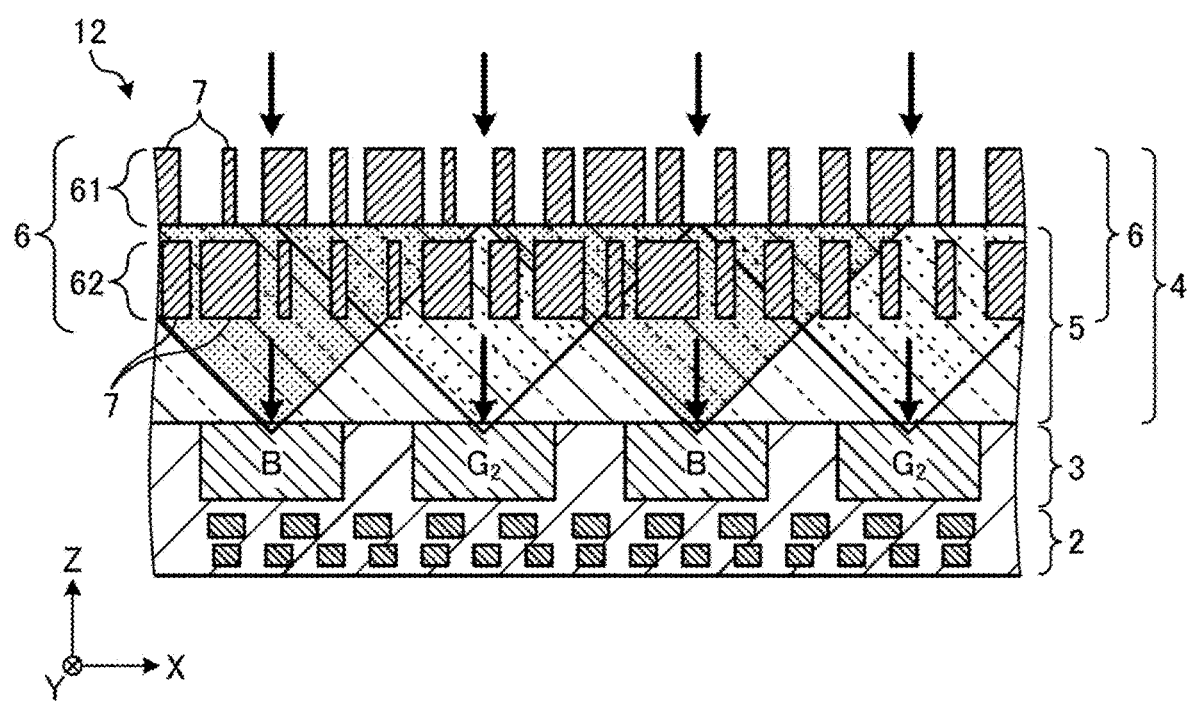
FIG. 4 is a diagram showing an example of a schematic configuration of the imaging element.

FIGS. 2 to 4 are diagrams showing an example of a schematic configuration of the imaging element. In the drawings, an XYZ coordinate system is shown. An XY plane direction corresponds to a plane direction of a layer such as a transparent layer 5 to be described later. Hereinafter, "plan view" indicates a view in a Z-axis direction (e.g., in a Z-axis negative direction), unless there is a more specific description. "Side view" indicates a view in an X-axis direction or a Y-axis direction (e.g., in a Y-axis negative direction).

The imaging element 12 includes a wiring layer 2, a pixel layer 3, and an optical element 4. The wiring layer 2, the pixel layer 3 and the optical element 4 are provided in that order in the Z-axis positive direction.

FIG. 2 schematically shows a layout of the pixel layer 3 in a plan view. The pixel layer 3 is a pixel array including a plurality of pixels disposed in an XY plane direction. Each pixel is configured to include a photoelectric conversion element. An example of the photoelectric conversion element is a photo diode (PD).

In this example, each pixel corresponds to any of red (R), green (g) and blue (B). When the wavelength is set as $\lambda_0$, an example of the wavelength range (wavelength band) of red light is $\lambda_0 > 600$ nm. An example of the wavelength range of green light is $600 \text{ nm} \geq \lambda_0 > 500$ nm. An example of the wavelength range of blue light is $500 \text{ nm} \geq \lambda_0$. The pixels R, $G_1$, $G_2$, and B are referred to and shown so that the respective pixels can be distinguished for each color. The four pixels R, $G_1$, $G_2$, and B are Bayer-disposed to constitute one pixel unit (color pixel unit).

FIG. 3 shows an example of a cross section of the imaging element 12 from the side along a line III-III of FIG. 2. FIG. 4 shows an example of a cross section of the imaging element 12 from the side along a line IV-IV of FIG. 2. In the drawing, arrows schematically indicate light incident on the imaging element 12. The incident light advances in a Z-axis negative direction and reaches the pixel layer 3 via the optical element 4.

The optical element 4 has a color filter function. The color filter function is a function of separating incident light into light of each color (each wavelength range). The color filter function can be called a color separation function, a spectral function, a light separation function, etc.

In this example, the optical element 4 guides red light of the incident light to the pixel R, green light to the pixels $G_1$ and $G_2$, and blue light to the pixel B. For example, most of the incident light of $\lambda_0 \geq 600$ nm is guided to the pixel R. Most of the light of $500 \text{ nm} < \lambda_0$ 600 nm is guided to the pixel $G_1$ and the pixel $G_2$. Most of the light of $\lambda_0 < 500$ nm is guided to the pixel B.

The optical element 4 may also have a lens function. The lens function is a function of condensing light of each color on a corresponding pixel. In this example, red light is condensed on the pixel R by the lens function. Green light is condensed on the pixel $G_1$ and the pixel $G_2$. Blue light is condensed on the pixel B.

The optical element 4 has both a color filter function and a lens function, unless there is a more specific description. Such an optical element 4 can also be referred to as a color separation microlens or the like.

In the pixel R, the pixel $G_1$, the pixel $G_2$, and the pixel B, charges corresponding to the amount of received light are generated. Charges are converted by transistors (not shown) or the like into an electric signal which becomes a basis of a pixel signal and output to the outside of a pixel 12 through the wiring layer 2. In FIG. 3, some of the wirings included in the wiring layer 2 are shown.

The optical element 4 is provided to cover the pixel layer 3. An example of the optical element 4 is a meta-surface, and is configured to include a plurality of structures 7 having a width equal to or less than the wavelength of light. The phase and the light intensity can be controlled depending on the characteristics (wavelength, polarization, incident angle, etc.) of the light by simply changing the parameters of the structure 7. The details of the structure 7 will be described later.

Figure 5:
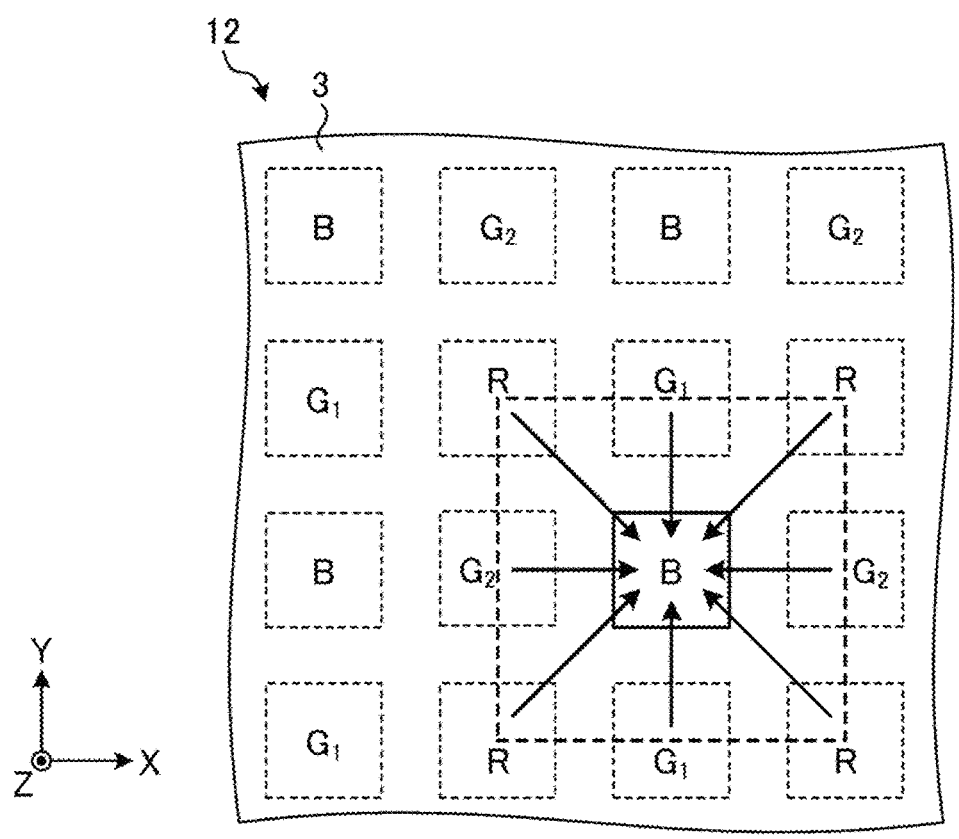
FIG. 5 is a diagram schematically showing light condensation on corresponding pixels.
Figure 6:
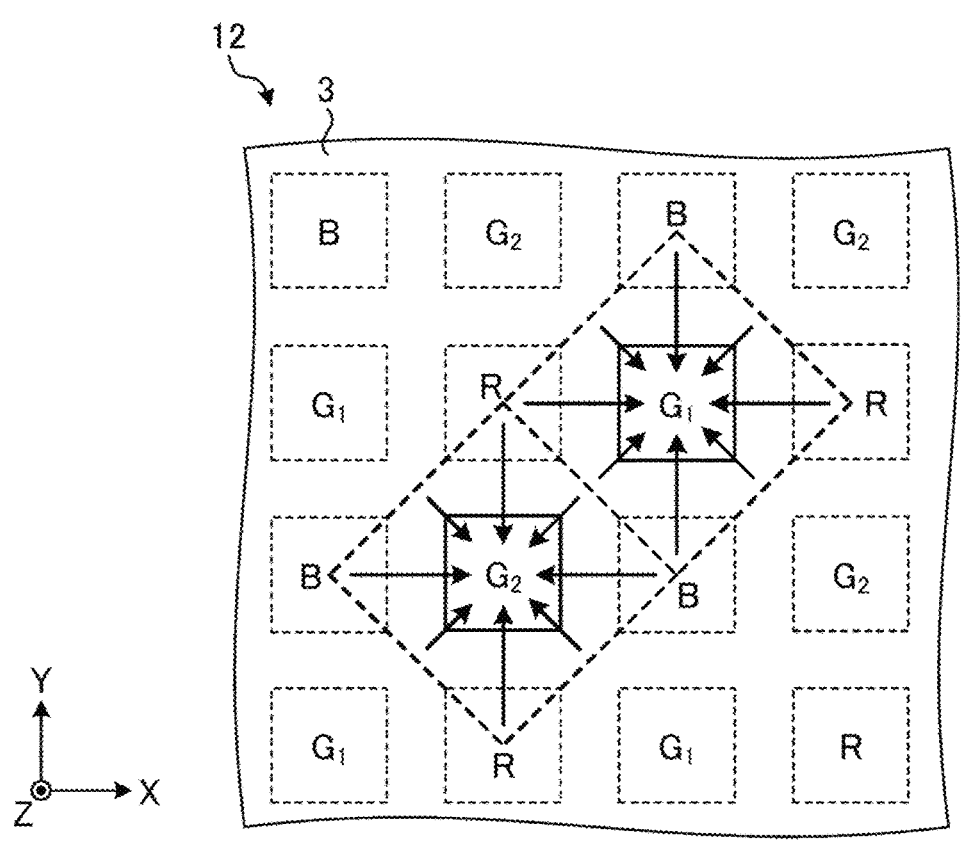
FIG. 6 is a diagram schematically showing light condensation on corresponding pixels.
Figure 7:
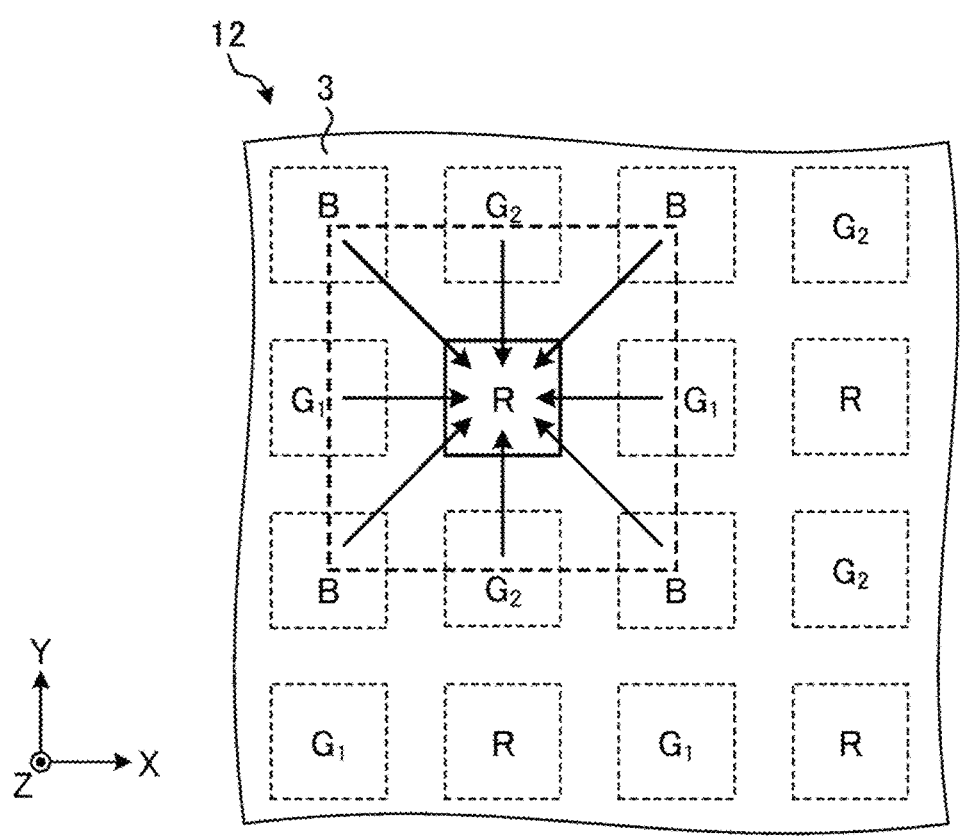
FIG. 7 is a diagram schematically showing light condensation on corresponding pixels.
Figure 8:
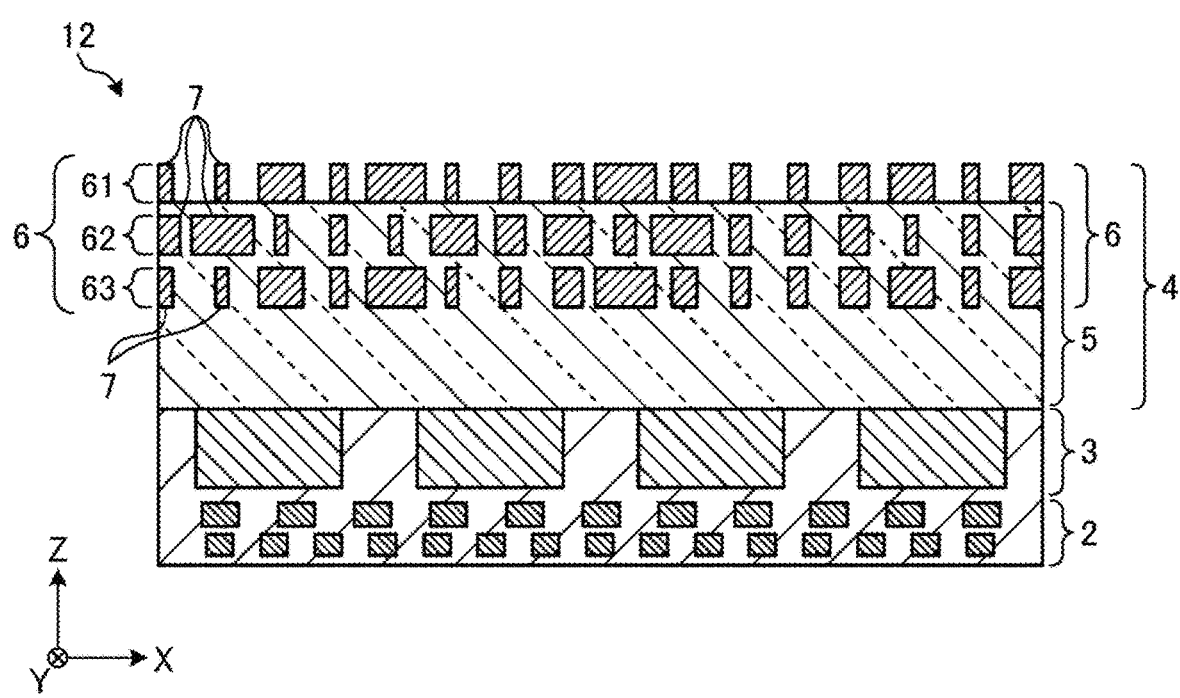
FIG. 8 is a diagram showing another example of a layered structure of the imaging element.

FIGS. 5 to 7 are diagrams schematically showing condensation on corresponding pixels. As shown by an arrow in FIG. 5, blue light is condensed on the pixel B. In this example, not only the light above the pixel B (in the Z-axis positive direction) but also the light above the pixels around the pixel B is condensed on the pixel B. The plurality of structures 7 that will be described later are disposed so that light of a color corresponding to the pixel B among light incident on the outside of a region opposite to the pixel B is also condensed on the pixel B. Thus, the amount of received light can be increased, as compared with a case where only the light incident on the region opposite to the pixel B is condensed on the pixel B.

As shown by an arrow in FIG. 6, green light is condensed on the pixels $G_1$ and $G_2$. In this example, not only the light above the pixels $G_1$ and $G_2$ but also the light above the pixels around the pixels $G_1$ and $G_2$ is condensed on the pixels $G_1$ and $G_2$. The plurality of structures 7 to be described later are disposed so that light of a color opposite to the pixel $G_1$ and the pixel $G_2$ among the light incident on the outside of a region opposite to the pixel $G_1$ and the pixel $G_2$ is also condensed on the pixel $G_1$ and the pixel $G_2$. Thus, the amount of received light can be increased, as compared with a case where only light incident on a region opposite to the pixels $G_1$ and $G_2$ is condensed on the pixels $G_1$ and $G_2$.

As shown by an arrow in FIG. 7, red light is condensed on the pixel R. In this example, not only the light above the pixel R but also the light above the pixels around the pixel R is condensed on the pixel R. The plurality of structures 7 to be described later are disposed so that light of a color corresponding to the pixel R among light incident on the outside of a region opposite to the pixel R is also condensed on the pixel R. Thus, the amount of received light can be increased, as compared with the case where only the light incident on the region opposite to the pixel R is condensed on the pixel R.

Returning to FIGS. 3 and 4 again, the optical element 4 includes a transparent layer 5 and a plurality of structure layers 6 in which a plurality of structures 7 are disposed. The refractive index of the transparent layer 5 is called a refractive index no. The refractive index of the structure 7 is called a refractive index $n_1$.

The transparent layer 5 is a layer for covering the pixel layer 3 and is provided on the pixel layer 3. The refractive index $n_0$ of the transparent layer 5 is lower than the refractive index $n_1$ of the structure 7. An example of a material of the transparent layer 5 is $SiO_2$ (refractive index 1.45) or the like, and in this case, the transparent layer 5 may be a $SiO_2$ substrate or the like. The transparent layer 5 may be an air layer, and in such a case, the refractive index of the transparent layer 5 may be the same as the refractive index of air. The material of the transparent layer 5 may be a single material, or may be a plurality of materials in a layered form.

Each of the plurality of structures 7 disposed in the structure layer 6 is a fine structure of a nano-order size having a dimension equal to or smaller than the wavelength of incident light, and is, for example, a columnar structure. The refractive index $n_1$ of the structure 7 is higher than the refractive index $n_0$ of the transparent layer 5. Examples of materials of the structure 7 are SiN (refractive index $n_1$=2.05), $TiO_2$ (refractive index $n_1$=2.40), and the like The plurality of structures 7 are disposed on the opposite side to the pixel layer 3 across at least a part of the transparent layer 5. The plurality of structures 7 are disposed in a plane direction (XY plane direction) of the layers of the transparent layer 5 and the structure layer 6 to condense light of a color corresponding to each of the plurality of pixels among the incident light to the corresponding pixels.

In this embodiment, the plurality of structures 7 are disposed in multiple layers. In each layer, the plurality of structures 7 are disposed periodically (having a periodic structure), for example, in the plane direction of the layer. The placement may be an equal interval placement or may be an non-equal interval placement for ease of design. The material of each structure 7 may be the same, or may differ from layer to layer.

In the examples shown in FIGS. 3 and 4, the plurality of structures 7 are disposed in two layers in the layer 61 (first layer) and the layer 62 (second layer). The layers 61 and 62 are layers that are adjacent to each other in a stacking direction (Z-axis direction). In this example, the layer 61 is provided on the transparent layer 5 on the side opposite to the pixel layer 3 with the transparent layer 5 interposed therebetween. The plurality of structures 7 disposed in the layer 61 are supported by the transparent layer 5. Above the transparent layer 5, these structures 7 are exposed to air, for example. The layer 62 is provided in the transparent layer 5. A plurality of structures 7 disposed in the layer 62 are embedded in the transparent layer 5.

In an embodiment, the plurality of structures 7 are disposed in multiple layers so that the structures 7 of each layer are positioned side by side in the stacking direction (Z-axis direction). The number of structures 7 (disposed in each layer) disposed in each layer 61 and 62 may be the same.

In the examples shown in FIGS. 3 and 4, each structure 7 disposed in the layer 61 and each structure 7 disposed in the layer 62 are aligned in the Z-axis direction. In a plan view, the structures 7 at least partially overlap each other. Since the light propagates through the inside of each of the structures 7 disposed in the layer direction, an optical phase delay amount p to be described later can be given to the light. For example, the light incident on a certain structure 7 in the layer 61 and propagated in the structure 7 is incident on the structure 7 in the layer 62 that at least partially overlaps the structure 7 in a plan view, and also propagates in the structure 7.

Each structure 7 aligned in the stacking direction may be disposed at intervals. A separation distance of this case may be equal to or less than the wavelength of the incident light (including the same degree). The wavelength here is the shortest wavelength in the wavelength range of an object of light reception, and is, for example, 410 nm. Multiple reflection between layers and dissipation, radiation, and the like of light after layer transmission are suppressed.

Figure 20:
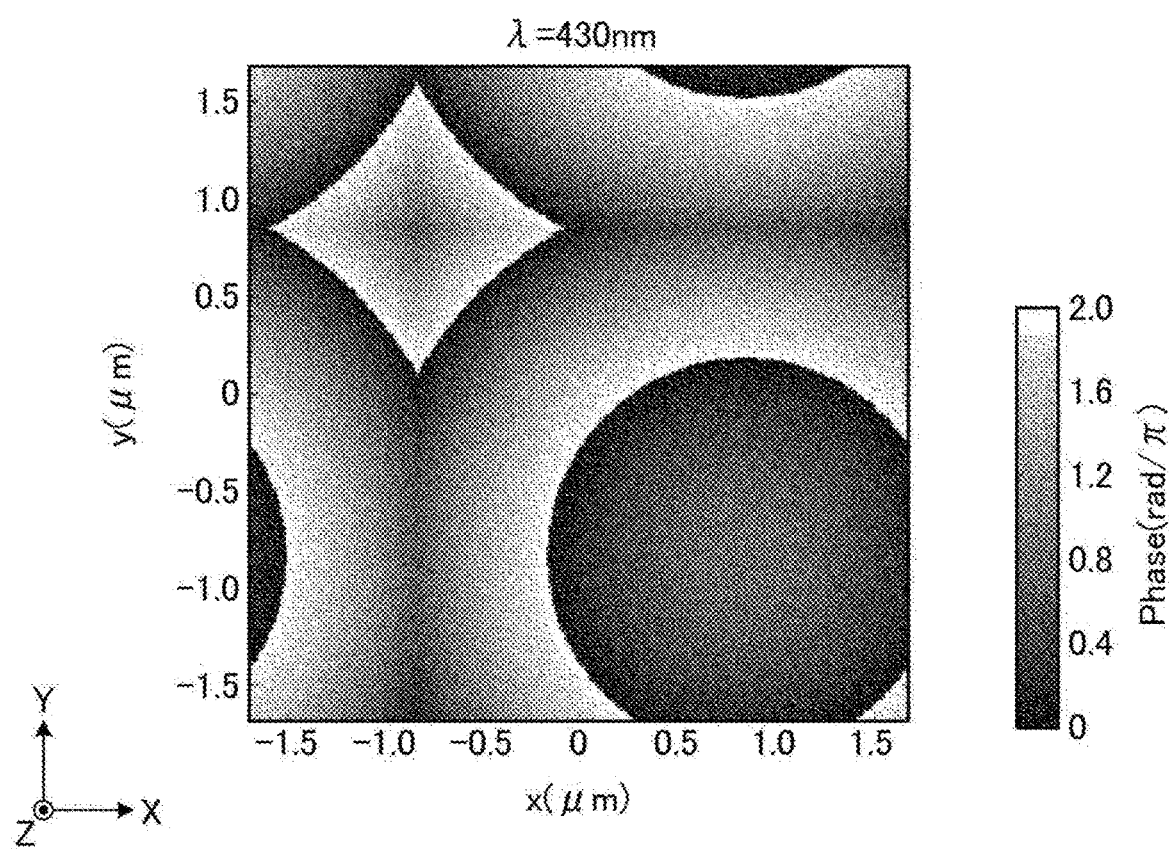
FIG. 20 is a diagram showing a specific example of a color separation microlens design.
Figure 21:
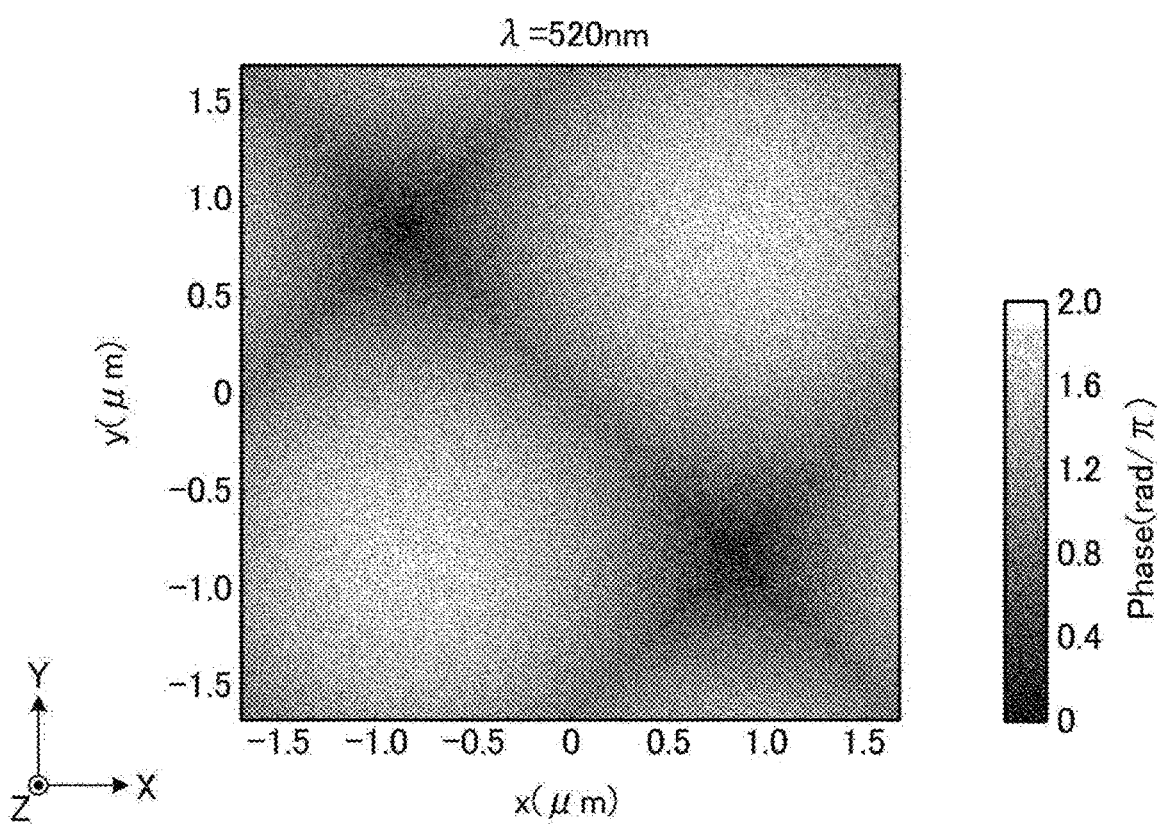
FIG. 21 is a diagram showing a specific example of a color separation microlens design.
Figure 22:
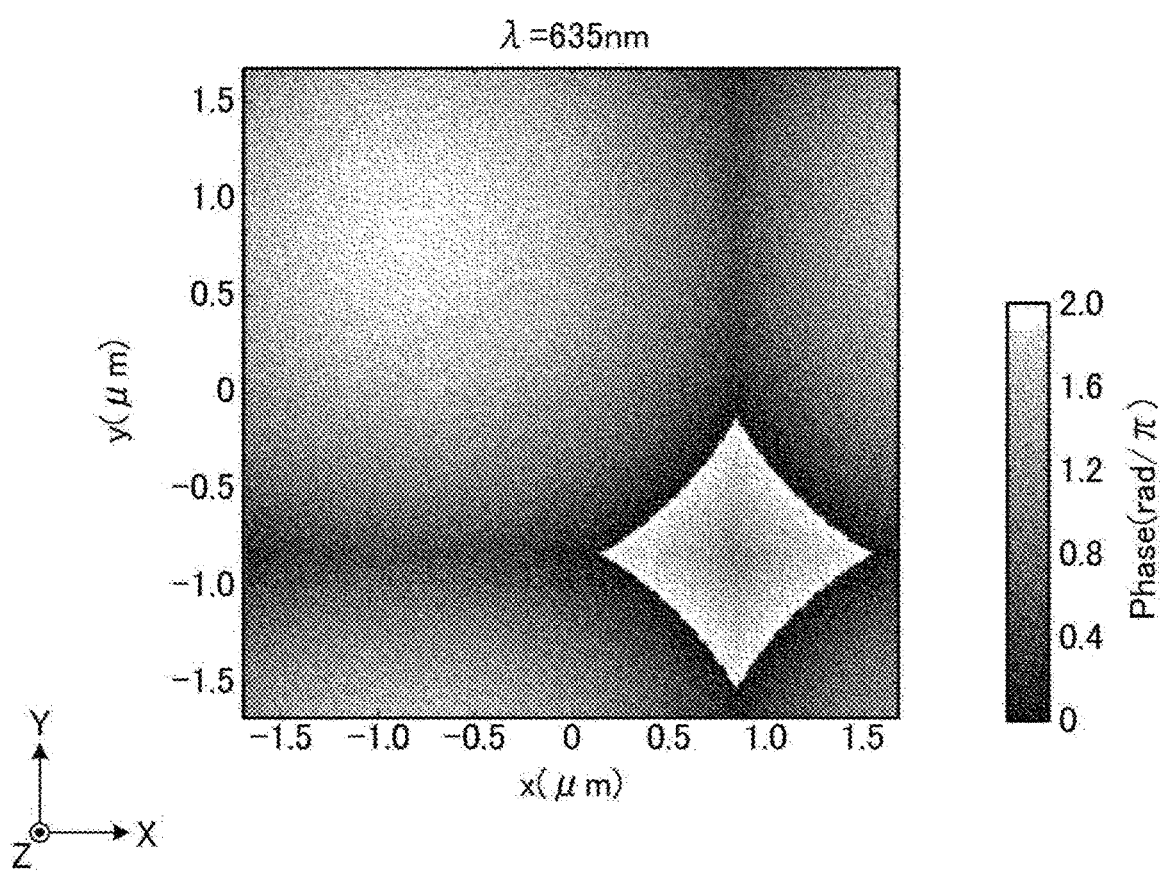
FIG. 22 is a diagram showing a specific example of a color separation microlens design.

A thickness (length in the Z-axis direction) of the structure 7 in a side view is referred to as a height of the structure 7. Each of the plurality of structures 7 disposed in multiple layers may have a height capable of giving an optical phase delay amount $\varphi$ of $2\pi$ or more to light propagated in each of the structures 7 aligned in the stacking direction. Thus, a desired optical phase delay amount distribution, which will be described later with reference to FIGS. 20 to 22, is easily realized.

The plurality of structures 7 may have the same height at least for each layer. For example, each structure 7 disposed in the layer 61 may have the same height. Each of the structures 7 disposed in the layer 62 may have the same height. There are merits such as facilitation of design and the like. All the structures 7 disposed in each layer may have the same height. The height of each of the plurality of structures 7 can be suppressed as a whole by aligning the heights of all the structures 7.

The layered structure of the imaging element 12 is not limited to the example shown in FIGS. 3 and 4. A specific example of other layered structure will be described with reference to FIGS. 8 to 12.

FIGS. 8 to 12 is a conceptual diagram showing other examples of the layered structure of the imaging element. In the example shown in FIG. 8, the structure layer 6 has a three-layer structure further including a layer 63 (third layer). The layer 63 is provided on the opposite side of the layer 61 with the layer 62 interposed therebetween. Of course, a layer configuration of four or more layers may be adopted.

Figure 9:
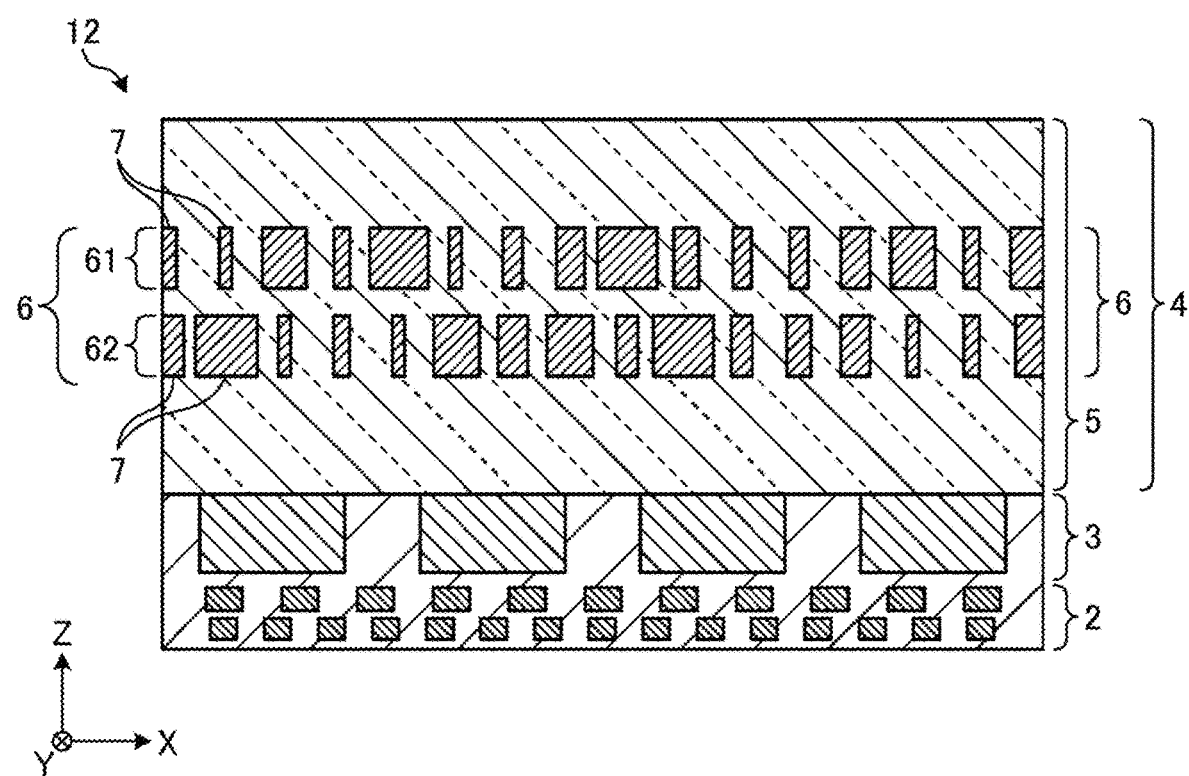
FIG. 9 is a diagram showing another example of the layered structure of the imaging element.
Figure 10:
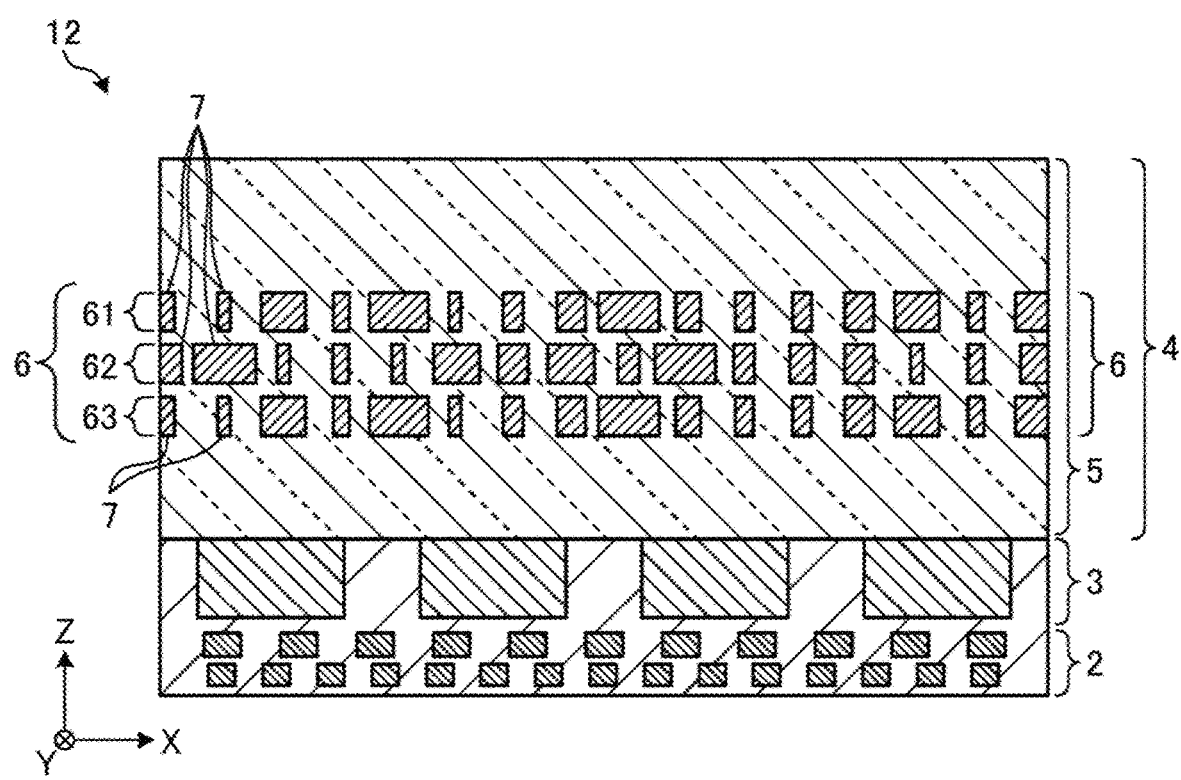
FIG. 10 is a diagram showing another example of the layered structure of the imaging element.

In the example shown in FIGS. 9 and 10, the structure layer 6 is provided in the transparent layer 5. In the example shown in FIG. 9, each structure 7 disposed in the layers 61 and 62 are all embedded in the transparent layer 5. In the example shown in FIG. 10, the structures 7 disposed in the layers 61, 62 and 63 are all embedded in the transparent layer 5.

Figure 11:
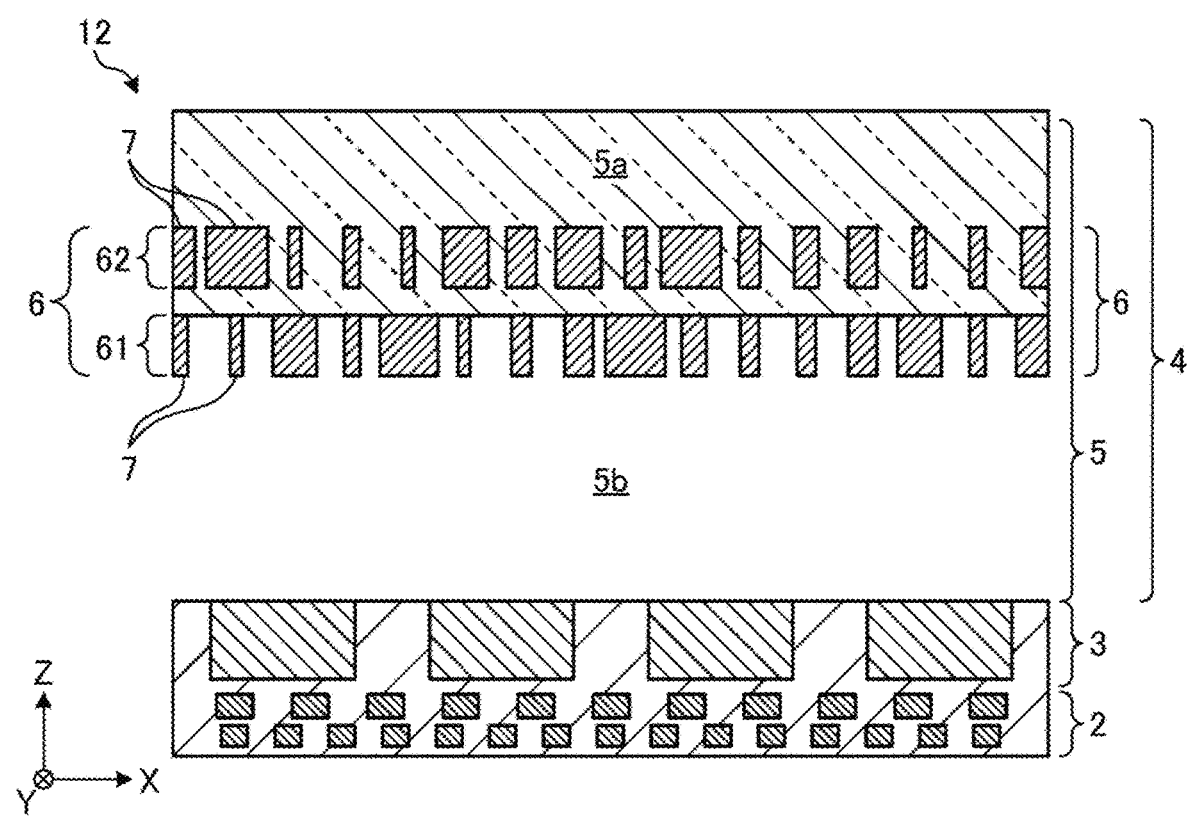
FIG. 11 is a diagram showing another example of the layered structure of the imaging element.
Figure 12:
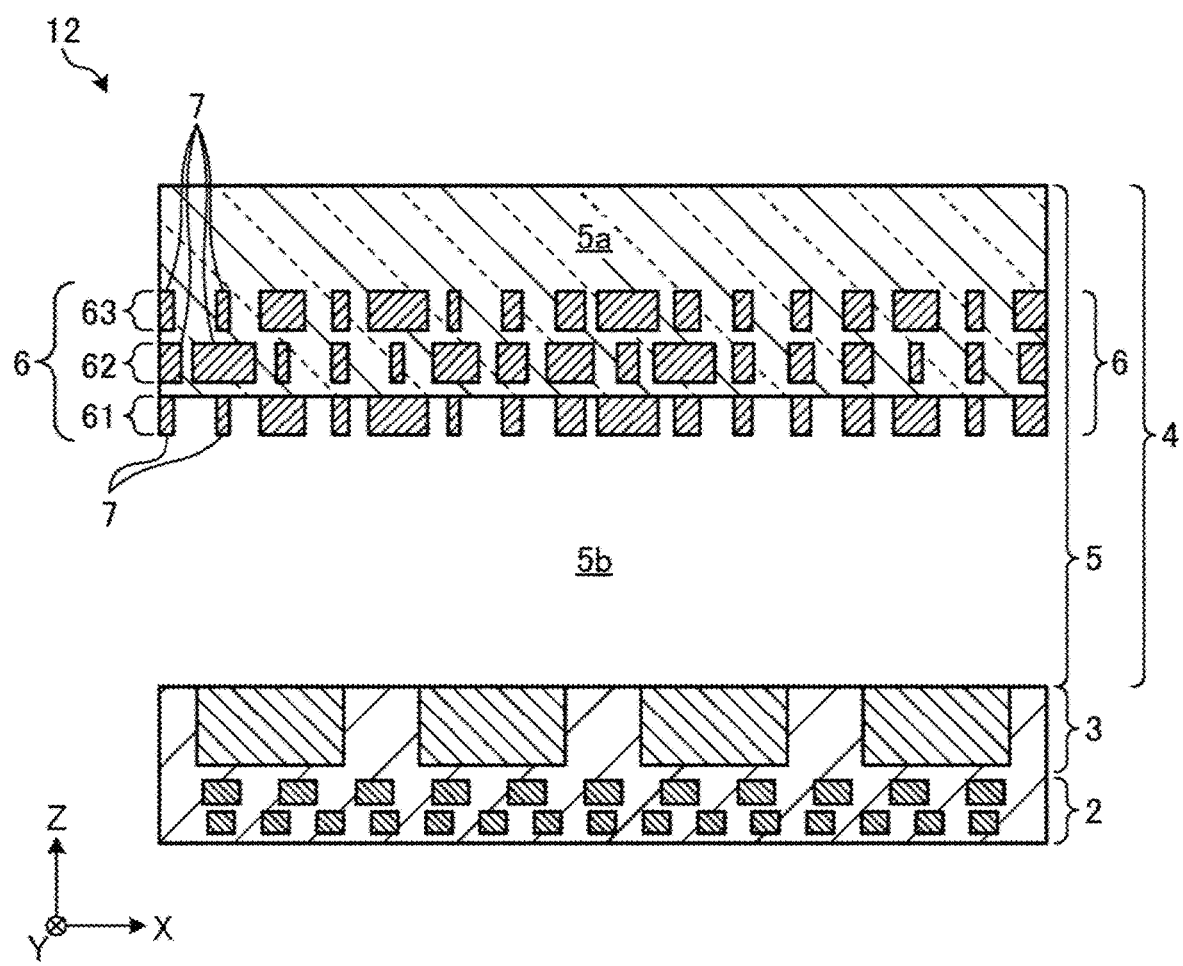
FIG. 12 is a diagram showing another example of the layered structure of the imaging element.

In the examples shown in FIGS. 11 and 12, the transparent layer 5 has a multilayer structure including a transparent substrate 5a and an air layer 5b. The air layer 5b is provided between the pixel layer 3 and the transparent substrate 5a. Each structure 7 disposed on the layer 61 (first layer) is supported by the transparent substrate 5a. These structures 7 extend into the air layer 5b with the transparent substrate 5a as a proximal end. Each structure 7 disposed in the other layer is embedded in the transparent substrate 5a. In the example shown in FIG. 11, each structure 7 disposed in the layer 62 is all embedded in the transparent substrate 5a. In the example shown in FIG. 12, each structure 7 disposed in the layers 62 and 63 is both embedded in the transparent substrate 5a.

The imaging element 12 may have various known configurations such as an on-chip microlens, an internal microlens, and an inter-pixel barrier for reducing crosstalk (not shown).

The types and dimensions of the cross-sectional shapes of each of the plurality of structures 7 in a plan view may be the same or different for each layer. For example, the types and dimensions of the cross-sectional shapes of each of the structures 7 disposed in the layer 61 may be the same. The types and dimensions of the cross-sectional shapes of each of the structures 7 disposed in the layer 62 may be the same. The types and dimensions of the cross-sectional shapes of all the structures 7 disposed in the layers 61 and 62 may be the same. Hereinafter, a case where structures 7 having different types and dimensions of cross-sectional shapes are present will be described as an example.

Figure 13:
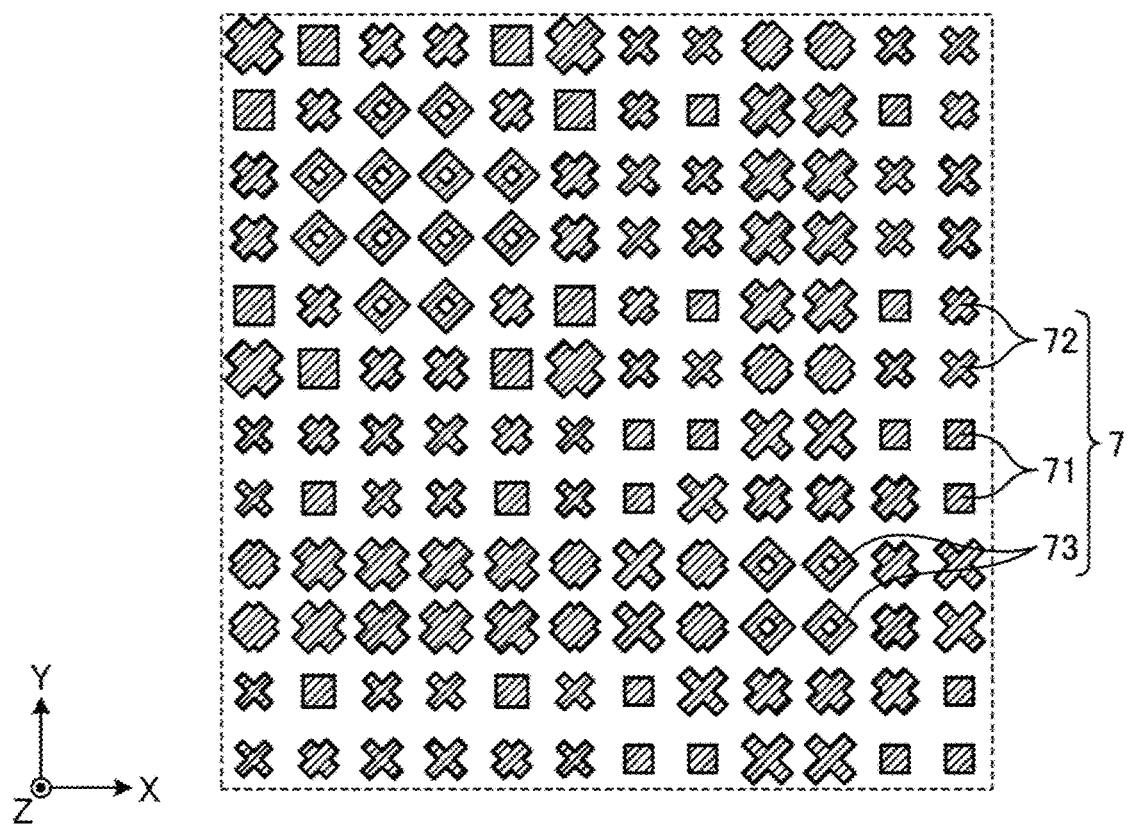
FIG. 13 is a diagram showing an example of a schematic configuration of a structure.
Figure 14:
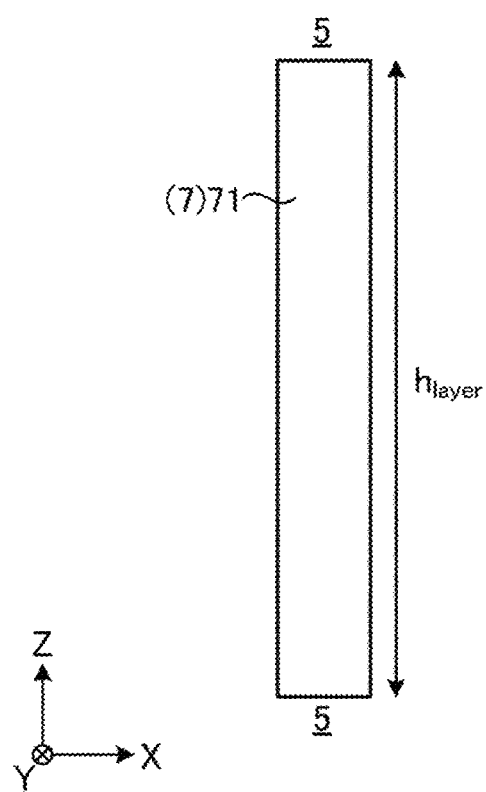
FIG. 14 is a diagram showing an example of a schematic configuration of a structure.
Figure 15:
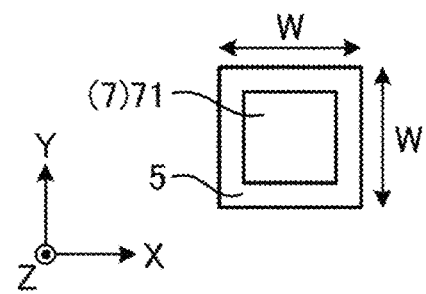
FIG. 15 is a diagram showing an example of a schematic configuration of a structure.
Figure 16:
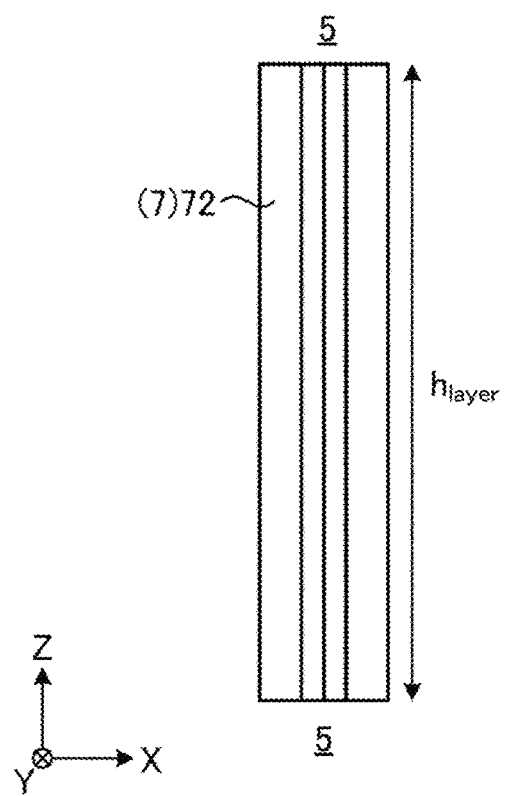
FIG. 16 is a diagram showing an example of a schematic configuration of a structure.
Figure 17:
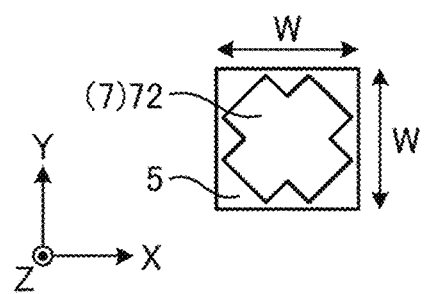
FIG. 17 is a diagram showing an example of a schematic configuration of a structure.
Figure 18:
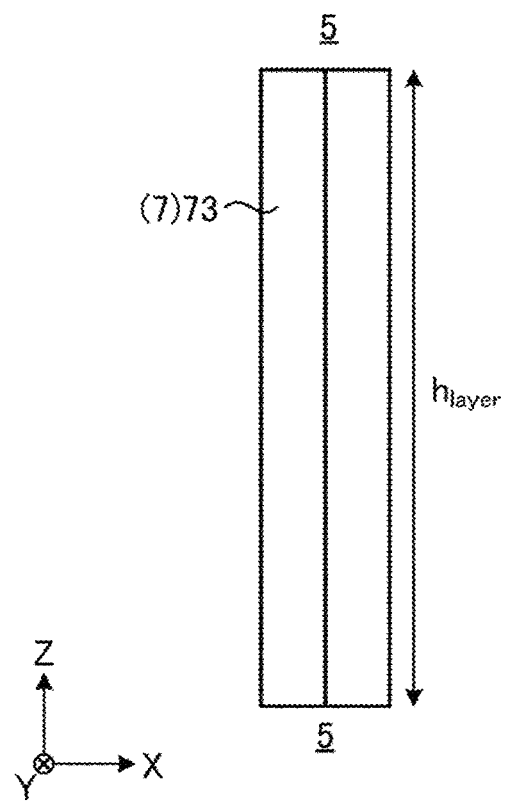
FIG. 18 is a diagram showing an example of a schematic configuration of a structure.
Figure 19:
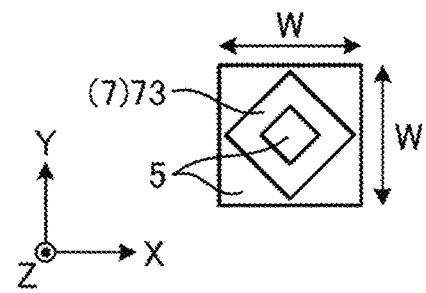
FIG. 19 is a diagram showing an example of a schematic configuration of a structure.

FIGS. 13 to 19 are diagrams showing examples of a schematic configuration of a structure. FIG. 13 schematically shows an example of the cross-sectional shapes of the plurality of structures 7 corresponding to a portion surrounded by a broken line XIII of FIG. 2. The structures 7 having different types of cross-sectional shapes are referred to as a structure 71, a structure 72, and a structure 73 in the drawing so that they can be distinguished from each other. FIGS. 14 and 15 are diagrams showing an example of a schematic configuration of the structure 71 in the side view and the top view. FIGS. 16 and 17 are diagrams showing an example of a schematic configuration of the structure 72 in the side view and the top view. FIGS. 18 and 19 are diagrams showing an example of a schematic configuration of the structure 73 in the side view and the top view. The height of the structure 7 in each layer is referred to as "height $h_{layer}$" and is shown.

All the cross-sectional shapes of the structures 7 shown by examples are four-time rotational symmetric shapes. The four-time rotational symmetric shape is configured to include at least one of, for example, a square shape, a cross shape, and a circular shape. By making the cross-sectional shape of the structure 7 into a four-time rotational symmetric shape, a polarization dependency can be prevented from occurring.

The cross-sectional shape of the structure 71 is a square shape. The cross-sectional shape of the structure 72 is an X-shape. The X-shape is an example of a shape including a cross shape, and is a shape obtained by rotating the cross shape in a plane by 45°. The cross-sectional shape of the structure 73 is a hollow rhombic shape. The hollow rhombic shape is an example of a shape configured to include a square shape, and is a shape obtained by rotating a hollow square shape having square holes in a plane by 450.

In addition, when a shape obtained by rotating in a plane by 45°, such as an X shape or a rhombus shape, is adopted, because optical coupling between the adjacent structures 7 in the XY plane direction is weakened, the optical characteristics of the respective structures are easily maintained without being affected by the adjacent structures. As a result, an ideal amount of phase delay distribution to be described later can be easily reproduced.

A width of the portion of the transparent layer 5 that surrounds (including on the inside) each structure 7 in the XY plane direction is referred to as a width W and is shown. The width W gives a placement period of the structure 7. The width W may be set to $W \leq (\lambda_{min}/n_0)$ not to generate diffracted light on the transmission side. $\lambda_{min}$ is the shortest wavelength in the wavelength band of a light reception object, and for example, 410 nm. The refractive index $n_0$ of the transparent layer 5 is 1.45 ($SiO_2$, and an example of the width W for a refractive index $n_1$=2.05 (SiN) of the structure 7 is 280 nm.

For example, as shown in FIG. 13, a plurality of structures 7 having various types of cross-sectional shapes and dimensions as described above are disposed in the XY plane direction. In the case of Bayer array, as can be seen from the comparison with FIG. 2 described above, the plurality of structures 7 disposed in the region opposite to the pixel $G_1$ (or the pixel $G_2$) have an overall placement structure in which the overall placement structure of the plurality of structures 7 disposed in the region opposite to the pixel $G_2$ (or the pixel $G_1$) is rotated by 90°. This is because the pixel R and the pixel B adjacent to each other in the pixel $G_1$ and the pixel $G_2$ are different from each other. By making the overall placement structure of the structure 7 above the pixels $G_1$ and $G_2$ common except for the point of rotating by 90, efficient light condensation can be performed even in complicated color placement such as Bayer array.

A principle of realizing the color separation microlens function using the plurality of structures 7 will be described. The following description is made on the assumption that a plurality of structures 7 are all embedded in the transparent layer 5 (for example, the structures shown in FIGS. 9 and 10). The basic principle is also the same for the other structures (for example, the structures shown in FIGS. 3, 4, 8, 11 and 12).

The structure 7 behaves as an optical waveguide that confines and propagates light within the structure. The structure 7 gives an amount of phase delay to light incident on the structure 7 and propagated in the structure 7. The amount of phase delay given by the structure 7 of each layer is referred to as an optical phase delay amount $\varphi_{layer}$.

An end face of the structure 7 on the Z-axis positive direction side is referred to as an upper face, and an end face of the structure 7 on the Z-axis negative direction side is referred to as a bottom face. Accordingly, when light enters from an upper face side of the structure 7, the light is propagated while being strongly confined inside the structure 7, and the light is subjected to an optical phase delay effect determined by an effective refractive index $n_{eff}$ of the optical waveguide and exits from the bottom face side. In each layer, a delay amount of the phase of the light propagated in the structure 7 with respect to the phase of the light when propagated in the transparent layer 5 outside the structure 7 is an optical phase delay amount $\varphi_{layer}$. When the wavelength of light in the vacuum is defined as $\lambda$, the optical phase delay amount $\varphi_{layer}$ is represented by the following formula (1).

[Math. 1]

$$\Phi_{layer} = (n_{eff} - n_0) \times \frac{2\pi h_{layer}}{\lambda} \quad (1)$$

Since the optical phase delay amount $\varphi_{layer}$ differs depending on the wavelength $\lambda$, a different optical phase delay amount $\varphi_{layer}$ corresponding to the wavelength range (color component) can be obtained. The effective refractive index $n_{eff}$ is known to largely depend on the cross-sectional shape of the structure 7, and is higher than the refractive index no and lower than the refractive index $n_1$ ($n_0 < n_{eff} < n_1$). The effective refractive index $n_{eff}$ varies depending on the wavelength $\lambda$, and the degree of the effective refractive index depends largely on the cross-sectional shape of the structure 7.

The optical phase delay amount player has wavelength dispersion characteristics. The plurality of structures 7 can be disposed to provide different light wave surfaces for each wavelength range by utilizing the wavelength dispersion characteristics. For example, by utilizing the structure 7 having various cross-sectional shapes as described above with reference to FIG. 13, it is possible to design various combinations of the optical phase delay amount $\varphi_{layer}$ corresponding to the wavelength $\lambda$ of light. Various color separation microlenses having different condensing positions according to wavelength ranges can be realized.

FIGS. 20 to 22 are diagrams showing specific examples of color separation microlens design. FIG. 20 shows an ideal optical phase delay amount distribution when a center wavelength is 430 nm (blue light). FIG. 21 shows an ideal optical phase delay amount distribution when the center wavelength is 520 nm (green light). FIG. 22 shows an ideal optical phase delay amount distribution when the center wavelength is 635 nm (red light).

The size of the pixel is 1.68 μm×1.68 μm. A focal length is 4.2 μm. The center wavelength corresponding to blue light is 430 nm. The center wavelength corresponding to green light is 520 nm. The center wavelength corresponding to the red light is 635 m.

When the ideal optical phase delay amount distribution is defined as φ (x, y), φ (x, y) is represented by the following formula (2). In formula (2), $\lambda_d$ represents the center wavelength (design wavelength). $X_f$, $y_f$, and $z_f$ represent condensing positions. n2 is a refractive index of the lower transparent layer 5. C is an arbitrary constant.

[Math. 2]

$$\phi(x, y) = -\frac{2\pi}{\lambda_d} n_2 \left( \sqrt{(x-x_f)^2 + (y-y_f)^2 + z_f^2} - \sqrt{x_f^2 + y_f^2 + z_f^2} \right) + C \quad (2)$$

The ideal optical phase delay amount distribution was a phase distribution which gives the following light condensing positions to each of the pixels B, $G_1$, $G_2$ and R. The center positions of four pixels (pixel units) correspond to x=0 and Y=0.

Pixel B: $x_f$=+0.84 μm, $y_f$=−0.84 μm, $z_f$=4.2 μm
Pixel $G_1$: $x_f$=+0.84 μm, $y_f$=+0.84 μm, $z_f$=4.2 μm
Pixel $G_2$: $x_f$=−0.84 μm, $y_f$=−0.84 μm, $z_f$=4.2 μm
Pixel R: $x_f$=−0.84 μm, $y_f$=+0.84 μm, $z_f$=4.2 μm The optical phase delay amount φ is converted so that it falls within the range of 0 to 2π. For example, −0.5π and 2.5π are converted into 1.5π and 0.5π, respectively. A boundary region of the optical phase delay amount distribution was set so that the optical phase delay amount distribution at each center wavelength is symmetrical to the right and left (together with an adjacent lens) with a condensing position as a center. The constant C may be optimized so that an error (difference from an ideal value) of the optical phase delay amount distribution is minimized at each wavelength.

For example, a plurality of structures 7 are disposed in multiple layers to obtain the optical phase delay amount distribution shown in FIGS. 20 to 22. The total sum of the optical phase delay amount $\varphi_{layer}$ given by the respective structures 7 disposed in the stacking direction gives the optical phase delay amount P at that position. As described above, since each of the plurality of structures 7 disposed in multiple layers has a height capable of giving an optical phase delay amount φ of 2π or more to the light propagated in each of the structures 7 disposed in the stacking direction, it is possible to cope with a desired optical phase delay amount distribution. From the optical phase delay amount φ at each wavelength, a structure 7 (structure 7 with minimum error) most suitable for the optical phase delay amount distribution at each center wavelength, for example, is disposed at a corresponding position.

For example, a color separation microlens having a desired optical phase delay amount distribution can be designed as described above. Although the above description has been given by taking the three-wavelength design as an example, the same design can also be applied to a plurality of wavelengths of two or four wavelengths or more.

When heights $h_{layer}$ of each of the plurality of structures 7 are the same, the height $h_{layer}$ is represented by the following formula (3), for example. In the formula (3), $\lambda_r$ is a desired center wavelength in a wavelength range on the longest wavelength side among wavelength ranges of light to be subjected to color separation. L is the number of layers. It is important that the height $h_{layer}$ can be reduced by the number of layers than in the case of a single layer placement. For example, even when a single layer placement requires a height of 1200 nm, the required height can be reduced to 600 nm which is half the height, using the two layer placement.

[Math. 3]

$$h_{layer} \geq \frac{1}{L} \frac{\lambda_r}{n_1 - n_0}, \quad (3)$$

As described in the above formula (1), by changing the cross-sectional shape and the dimension of the structure 7 for each layer, the value of the effective refractive index $n_{eff}$ and the wavelength dispersion can be changed for each layer. Since the optical phase delay amount φ is the sum of the optical phase delay amounts $\varphi_{layer}$ of the respective layers, the degree of freedom of design can be increased by variously combining the optical phase delay amounts $\varphi_{layer}$ of the respective layers. The design parameters are increased by the number of layers, the light controllability is improved, and a more efficient color separation function can be obtained. Color separation with high contrast, reduction of color crosstalk, and the like can also be performed.

As described above, the optical element 4 realizes a color separation function and a lens function, by disposing a plurality of structures 7 in multiple layers. For example, when a filter (color filter or the like) is used in place of the optical element 4, since light of a wavelength other than a transmission wavelength range is absorbed by the filter, the light quantity after transmitting the filter remains only about one third of the light quantity of the light incident on the filter, and the light reception efficiency is lowered. In the case of the optical element 4, the light quantity after transmission is considerably larger (for example, 90% or more) than that, and the light reception efficiency and sensitivity are greatly improved.

Although there is also known a configuration in which microlenses are provided on the opposite side of the pixel with a filter interposed therebetween, in this case, because it is a configuration of at least two layers of the filters and the microlenses, the configuration is complicated and the manufacturing cost is also increased. By realizing the color separation function and the lens function only by the optical element 4, the configuration is simplified and the manufacturing cost can be reduced. Further, an aperture ratio is increased by the amount that the plurality of structures 7 can be disposed in a plane (in an XY plane) without any gap.

Since the plurality of structures 7 are disposed in multiple layers, the height $h_{layer}$ of the structures 7 of each layer can be reduced as compared with the case of a single layer placement such as a NPL 1. As shown in the above formula (3), in the case of a single layer placement (the number of layers L=1), the height $h_{layer}$ needs to be $\lambda_r/(n_1-n_0)$ or more. In the visible light region, when the materials of the transparent layer 5 and the structure 7 are $SiO_2$ and SiN, the height $h_{layer}$ is, for example, 1,060 nm or more. When the placement period of the single-layered structure 7 is set to be equal to or less than the shortest wavelength, for example, 280 nm (λ=410 nm), the aspect ratio of the structure 7 is about 3.8 or larger.

The actual dimension of the cross-sectional shape of the structure 7 is designed to be smaller than the above-mentioned period for the purpose of relaxing optical coupling with the adjacent structure 7. When the maximum dimension of the cross-sectional shape is defined as 200 nm, the aspect ratio is about 5.3 or larger. In addition, smaller dimensions may be used for the control of the effective refractive index $n_{eff}$, and when the minimum dimension is defined as 80 nm, the aspect ratio is about 13.3 or larger.

In order to manufacture the structure 7 having the above-mentioned high aspect ratio by a normal semiconductor process, a high-level manufacturing technique is required. The manufacturing error becomes large, and there are problems such as a decrease in yield and an increase in manufacturing cost.

By disposing the plurality of structures 7 in multiple layers as in the present embodiment, the height of the entire structure 7 can be shared (divided) by the structures 7 of each layer, and the height $h_{layer}$ of the structures 7 in each layer can be reduced as compared with the case of a single layer placement. As a result, the aspect ratio of the structure 7 can be reduced.

For example, in the case of a visible light region, when materials of the transparent layer 5 and the structure 7 are $SiO_2$ and SiN, and the number of layers L is two-layer configuration, the height of the structure 7 in each layer is sufficient at 530 nm or more, which is about half that of the single-layer placement. The aspect ratio can be reduced to about 1/2. Similarly, in the case of a three-layer placement, the aspect ratio can be reduced to about 1/3.

By reducing the aspect ratio of the structure 7, the manufacturing difficulty of the plurality of structures 7 can be reduced. For example, manufacturing costs can be reduced, accordingly. The optical element 4 including the plurality of structures 7, the imaging element 12 including the optical element 4, and the imaging device 10 including the imaging element 12 can be reduced in manufacturing difficulty or suppressed in manufacturing cost.

Returning to FIG. 1, the signal processing unit 13 of the imaging device 10 will be described. The signal processing unit 13 generates a pixel signal based on an electrical signal obtained from the imaging element 12. In order to obtain an electric signal, the signal processing unit 13 also controls the imaging element 12. The control of the imaging element 12 includes exposure of the pixel of the imaging element 12, conversion of the electric charge accumulated in the pixel layer 3 into an electric signal, reading of the electric signal, and the like.

Although the embodiment of the present disclosure has been described above, the optical element, the imaging element and the imaging device according to the embodiment can be variously modified within the scope not departing from the spirit of the embodiment. Some modified examples will be described.

Figure 23:
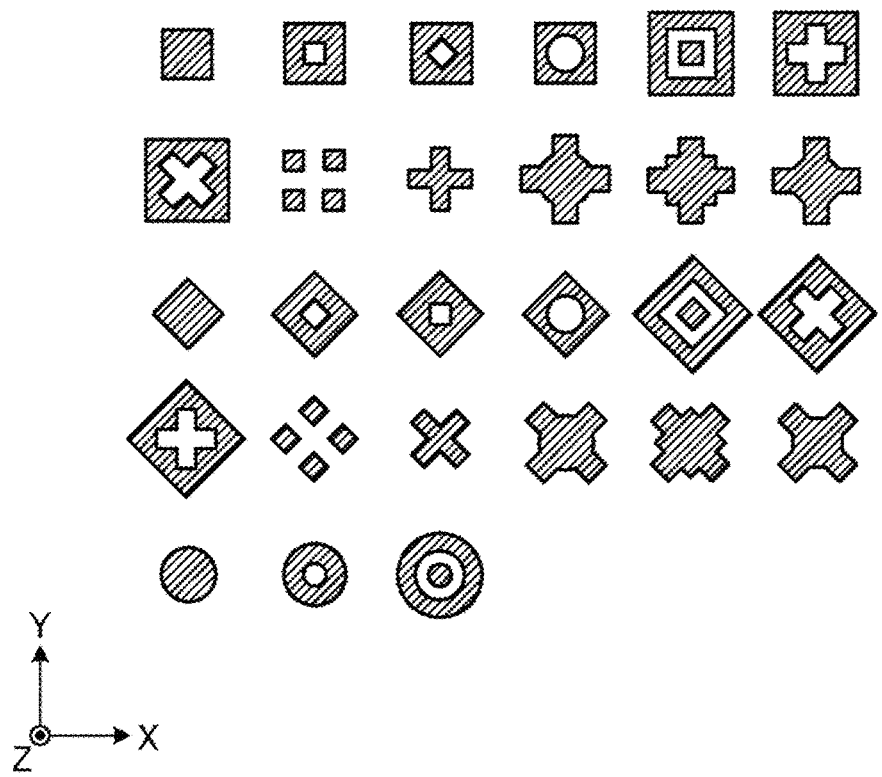
FIG. 23 is a diagram showing an example of a cross-sectional shape of a structure.

Further, the cross-sectional shape of the structure 7 is not limited to the shape shown in FIG. 13. FIG. 23 is a diagram showing an examples of a cross-sectional shape of a structure. The structure 7 may have various cross-sectional shapes as shown. The exemplified shape are four-time rotational symmetrical shapes obtained by combining various shapes of, for example, a square shape, a cross shape, and a circular shape.

Figure 24:
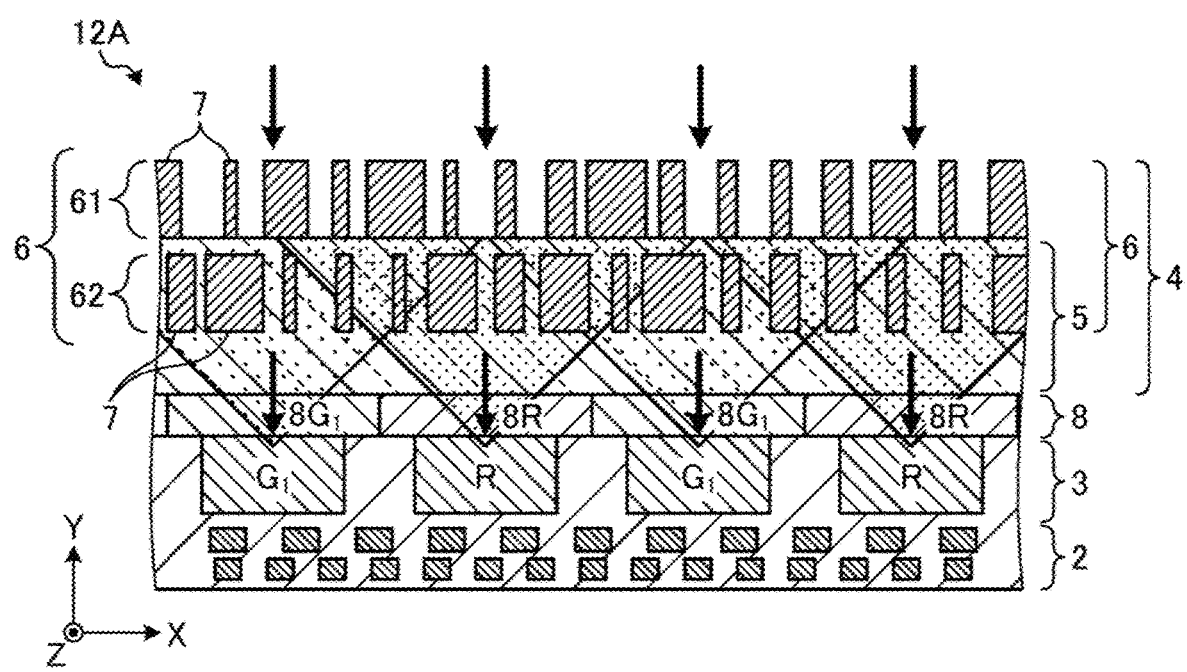
FIG. 24 is a diagram showing an example of a schematic configuration of an imaging element according to a modified example.
Figure 25:
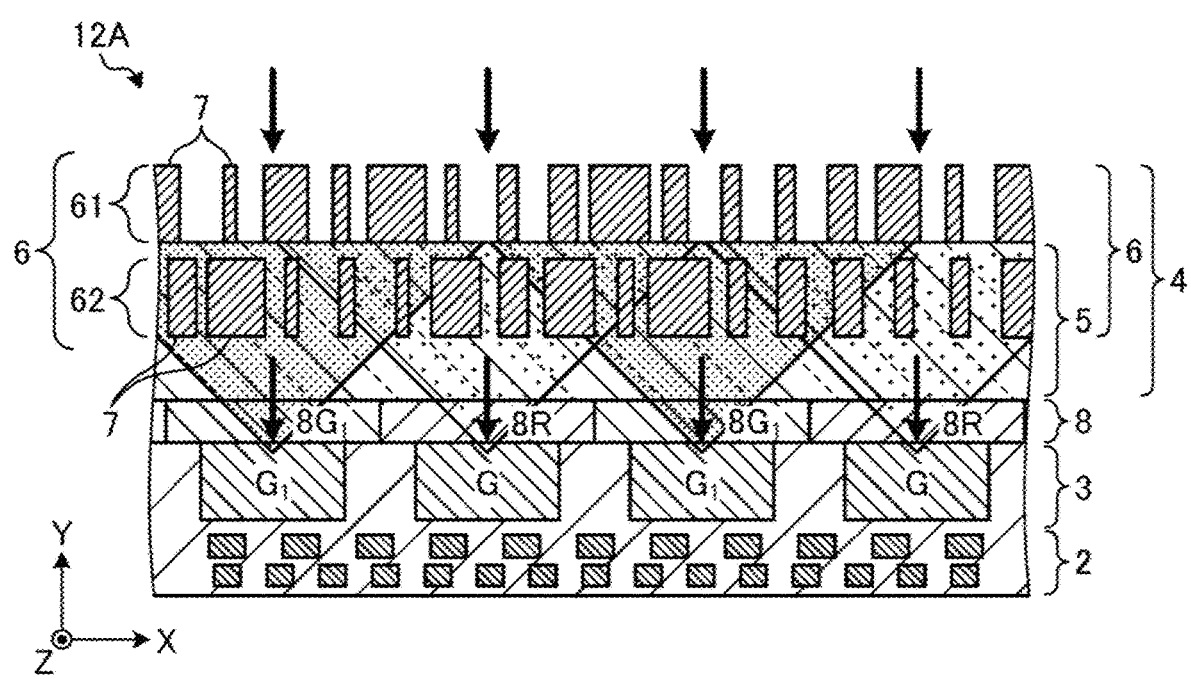
FIG. 25 is a diagram showing an example of a schematic configuration of the imaging element according to a modified example.

The imaging element may include a filter. FIGS. 24 and 25 are diagrams showing the example of a schematic configuration of the imaging element according to such a modified example. The shown imaging element 12A includes a filter layer 8 provided between the pixel layer 3 and the optical element 4 (the transparent layer 5 thereof). FIG. 24 shows an example of the cross section of the imaging element 12A when viewed from the side along the line III-III' in a case where the imaging element 12 is replaced with the imaging element 12A in FIG. 2. FIG. 25 shows an example of the cross section of the imaging element 12A when viewed from the side along the line IV-V' in a case where the imaging element 12 is replaced with the imaging element 12A in FIG. 2.

The filter layer 8 includes a filter 8R, a filter $8G_1$, a filter $8G_2$, and a filter 8B. The filter 8R is provided to cover the pixel R and allows red light to pass through. The filter $8G_1$ is provided to cover the pixel $G_1$, and allows green light to pass through. The filter $8G_2$ is provided to cover the pixel $G_2$, and allows green light to pass through. A filter 8B is provided to cover the pixel B and allows the blue light to pass through. Examples of materials of the filter 8R, the filter $8G_1$, the filter $8G_2$ and the filter 8B are organic materials such as resin.

The light color-separated by the optical element 4 further passes through the filter layer 8 and then reaches the pixel layer 3. By color separation of both the optical element 4 and the filter layer 8, cross talk of spectrum is suppressed (most of unnecessary other color components are removed), compared with a case where color separation is performed only on one side, and color reproducibility is improved. Since the incident light passes through the filter layer 8 after being separated by the optical element 4, the light quantity is not greatly reduced. Therefore, the light reception efficiency of the pixel is improved, as compared with the case where the optical element 4 is not provided and only the filter layer 8 is provided.

According to the imaging element 12A having the filter layer 8, it is possible to improve the light reception efficiency and to further improve the color reproducibility.

In the above embodiment, SiN and $TiO_2$ were exemplified as the material of the structure 7. The material of the structure 7 is not limited to these examples. For example, for light of light having a wavelength of 380 nm to 1,000 nm (visible light to near infrared light), SiC, $TiO_2$, GaN or the like may be used as a material of the structure 7, in addition to SiN. These materials are suitable, because they have a high refractive index and a small absorption loss. In the case of using the light with a wavelength of 800 to 1,000 nm (near infrared light), Si, SiC, SiN, $TiO_2$, GaAs, GaN or the like may be used as a material of the structure 7. These materials are suitable because of low loss. InP or the like can be used as the material of the structure 7, in addition to the materials described above, for light in the near-infrared region of long wavelength band (communication wavelengths of 1.3 μm, 1.55 μm, etc.).

When the structure 7 is formed by pasting, coating, etc., polyimide such as fluorinated polyimide, benzocyclobutene (BCB), photocurable resin, UV epoxy resin, acrylic resin such as PMMA, polymer such as resist in general, etc. are mentioned as materials.

Although an example is shown in which $SiO_2$ and an air layer are assumed as the materials of the transparent layer 5 in the above embodiment, the present invention is not limited thereto. Any material having a refractive index lower than that of the material of the structures 7, including a general glass material, and having low loss with respect to the wavelength of incident light may be used. Since the transparent layer 5 may have sufficiently low loss for the wavelength of light to reach a corresponding pixel, it may be made of the same material as the color filter, and may be made of an organic material, for example, a resin. In this case, the transparent layer 5 is not only made of the same material as that of the color filter but also may have the same structure as that of the color filter, and may be designed to have absorption characteristic corresponding to the wavelength of light to be guided to corresponding pixels.

In the above embodiment, although the three primary colors R, G and B are taken as examples as the colors corresponding to the pixel, the pixel may correspond to light having wavelengths other than the three primary colors (for example, infrared light or ultraviolet light).

In the above embodiment, an example in which structures having three different cross-sectional shapes such as the structures 71, 72 and 73 are used as the structure 7 has been described. However, one type of structure (for example, the structure 71, the structure 72 or the structure 73) may be used, or four or more types of structures may be used.

Although the present invention has been described above based on a specific embodiment, it is needless to say that the present invention is not limited to the above-described embodiment and can be variously modified without departing from the gist thereof.

The techniques described above are specified, for example, as follows. One of the disclosed techniques is an optical element 4. As described with reference to FIGS. 3 and 4, the optical element 4 includes a transparent layer 5 for covering a plurality of pixels (for example, pixels R, $G_1$, $G_2$ and B) each including a photoelectric conversion element, and a plurality of structures 7 disposed in a plane direction (XY plane direction) of the transparent layer 5 on the opposite side to the plurality of pixels across at least a part of the transparent layer 5. The plurality of structures 7 are disposed in multiple layers to guide light of a color corresponding to each of the plurality of pixels among incident light to the corresponding pixel.

The optical element 4 realizes a color separation function by a plurality of structures 7 disposed in multiple layers. Thus, the aspect ratio of the structure 7 of each layer can be reduced and the difficulty of manufacturing the structure 7 can be reduced, compared with the case of single layer placement.

As described with reference to FIGS. 14 to 19 and the like, each of the plurality of structures 7 is a columnar structure having a refractive index $n_1$ higher than a refractive index $n_0$ of the transparent layer 5 and giving an optical phase delay amount $\varphi_{layer}$ to light propagated in the structure 7, at least a part of the structures 7 disposed in each layer overlaps with each other when viewed in a plan (when viewed in the Z-axis direction), and each of the plurality of structures 7 may have a height $h_{layer}$ capable of giving an optical phase delay amount $\varphi$ of $2\pi$ or more to light propagated in each of the structures 7 aligned in the stacking direction (Z-axis direction). For example, by disposing a plurality of such structures 7 in multiple layers, the aspect ratio of the structures 7 of each layer can be reduced, while achieving a color separation function.

As described with reference to FIGS. 20 to 22, etc., the plurality of structures 7 may be disposed in multiple layers according to the optical phase delay amount distribution to condense the light of the corresponding color to the corresponding pixel. Thus, the lens function can also be realized. A plurality of structures 7 disposed in multiple layers can be used as color separation microlenses. For example, the configuration can be simplified and the manufacturing cost can be reduced, as compared with the case where a two-layer configuration of a filter for color separation and a microlens is adopted. Further, the aperture ratio is increased by the amount that the plurality of structures 7 can be disposed in a plane (in an XY plane) without any gap.

As described with reference to FIGS. 3 and 4, the plurality of structures 7 may have the same height $h_{layer}$ at least for each layer. There are merits such as facilitation of design and the like. When all the structures 7 have the same height $h_{layer}$, the height of each of the plurality of structures 7 can be suppressed as a whole.

As described with reference to FIGS. 3 and 4 and the like, the plurality of structures 7 may be disposed in multiple layers so that the structures of each layer are aligned in the stacking direction (Z-axis direction), and the number of the structures 7 disposed in the respective layers may be the same. Since the light propagates through the inside of each of the structures 7 aligned in the layer direction, it is possible to give an optical phase delay amount p.

As described with reference to FIGS. 3, 4, 9, 10 and the like, a plurality of structures 7 may be embedded in the transparent layer 5. Color separation and microlens design based on the refractive index $n_0$ of the transparent layer 5 are made possible, and the design is facilitated.

The imaging element 12 and the imaging device 10 described with reference to FIGS. 1 to 4 or the like are also one of the disclosed technique The imaging element 12 includes an optical element 4, and a plurality of pixels covered with the transparent layer 5. Specifically, the imaging device 10 includes an imaging element 12, and a signal processing unit 13 that generates an image signal on the basis of an electric signal obtained from the imaging element 12.

REFERENCE SIGNS LIST

1 Object
2 Wiring layer
3 Pixel layer
R pixel
$G_1$ Pixel
$G_2$ Pixel
B pixel
4 Optical element
5 Transparent layer
5a Transparent substrate
5b Air layer
6 Structure layer
61 Layer
62 Layer
63 Layer
7 Structure
71 Structure
72 Structure
73 Structure
8 Filter layer
10 Imaging device
11 Lens optical system
12 Imaging element
13 Signal processing unit

The invention claimed is:

1. An optical element comprising: a transparent layer for covering a pixel layer comprising a plurality of pixels each including a photoelectric conversion element, wherein the transparent layer comprises a transparent substrate and an air layer, wherein the air layer is located between the pixel layer and the transparent substrate; and a plurality of structures disposed in multiple layers comprising at least a first layer and a second layer, wherein structures in the first layer are disposed in the air layer, and structures in the second layer are disposed in the transparent substrate, wherein the plurality of structures disposed in the multiple layers are configured to guide light of a color corresponding to each of the plurality of pixels among incident light to a corresponding pixel.

2. The optical element according to claim 1,
wherein each of the plurality of structures is a columnar structure which has a refractive index higher than a refractive index of the transparent layer, and gives an optical phase delay amount to light propagating in each of the plurality of structures,
one or more of the structures in the first layer overlap one or more of the structures in the second layer, and
each of the plurality of structures has a height capable of giving the optical phase delay amount of $2\pi$ or more to the light propagating in each of the plurality of structures disposed in a stacking direction.

3. The optical element according to claim 1,
wherein the plurality of structures are disposed in the multiple layers according to an optical phase delay amount distribution for condensing the light of the corresponding color on the corresponding pixel.

4. The optical element according to claim 1,
wherein the plurality of structures have a same height at least for each layer.

5. The optical element according to claim 1,
wherein the plurality of structures are disposed in the multiple layers so that structures in each layer are disposed side by side in a stacking direction, and
a number of the structures disposed in each layer is the same.

6. An imaging element comprising:
the optical element according to claim 1; and
the plurality of pixels covered with the transparent layer.

7. An imaging device comprising:
the imaging element according to claim 6; and
a signal processing unit which generates a pixel signal on a basis of an electrical signal obtained from the imaging element.

8. The optical element of claim 1, wherein each structure has a dimension equal to or smaller than a wavelength of the incident light.

* * * * *